United States Patent [19]

Miwa

[11] Patent Number: 5,666,001
[45] Date of Patent: Sep. 9, 1997

[54] TRANSISTOR WHEREIN THE BASE AREA IS COVERED WITH AN INSULATING LAYER WHICH IS OVERLAID WITH A CONDUCTIVE FILM THAT MIGHT BE POLYSILICON CRYSTAL OR ALUMINUM

[75] Inventor: Hiroyuki Miwa, Kanagawa, Japan

[73] Assignee: Siemens Aktiengesellschaft, Munich, Germany

[21] Appl. No.: 201,026

[22] Filed: Feb. 24, 1994

Related U.S. Application Data

[62] Division of Ser. No. 127,507, Sep. 28, 1993, Pat. No. 5,416,031.

[30] Foreign Application Priority Data

Sep. 30, 1992 [JP] Japan .................. 4-285045
Sep. 30, 1992 [JP] Japan .................. 4-285046
Sep. 30, 1992 [JP] Japan .................. 4-285047

[51] Int. Cl.$^6$ .............. H01L 29/76; H01L 29/00; H01L 27/082; H01L 27/102
[52] U.S. Cl. .......... 257/592; 257/370; 257/556; 257/557; 257/575; 257/630; 438/339
[58] Field of Search .................. 257/370, 557, 257/556, 575, 592, 488, 630; 437/31, 32

[56] References Cited

U.S. PATENT DOCUMENTS

| | | | |
|---|---|---|---|
| 4,581,319 | 4/1986 | Wieder et al. | 437/31 |
| 4,859,630 | 8/1989 | Josquin | 437/31 |
| 5,070,381 | 12/1991 | Scott et al. | 257/592 |
| 5,089,429 | 2/1992 | Hsu | 437/31 |
| 5,323,057 | 6/1994 | Cook et al. | 257/592 |

FOREIGN PATENT DOCUMENTS 3275174  11/1988  Japan .................. 257/592

*Primary Examiner*—Mahshid D. Saadat
*Assistant Examiner*—Valencia Martin Wallace
*Attorney, Agent, or Firm*—Hill, Steadman & Simpson

[57] ABSTRACT

In production of a Bi-CMOS semiconductor device, when forming a lateral PNP transistor in a bipolar section, an oxide film is deposited on this base area to prevent etching damages such as those in forming an LDD spacer for a MOS section, thus degradation of the lateral PNP bipolar transistor and drop of yield in production thereof being prevented and a high performance (low cost) Bi-CMOS LSI being realized.

3 Claims, 10 Drawing Sheets

TRANSISTOR WHEREIN THE BASE AREA IS COVERED WITH AN INSULATING LAYER WHICH IS OVERLAID WITH A CONDUCTIVE FILM THAT MIGHT BE POLYSILICON CRYSTAL OR ALUMINUM

This is a division of application Ser. No. 08/127,507 filed Sep. 28, 1993 now U.S. Pat. No. 5,416,031.

BACKGROUND OF THE INVENTION

1. Field of the Invention

The present invention relates to a method of producing bipolar transistors as well as semiconductor devices available for production of bipolar transistors. The present invention is applicable, for instance, to production of semiconductor devices each available as a lateral bipolar transistor and having a bipolar transistor section and a MOS transistor section.

2. Description of the Related Art

In recent years, increasingly larger scale and higher performance semiconductor devices have been demanded, and in association with this tendency the Bi-CMOS LSI having both the advantages of high integrity and low power consumption specific to CMOS and of high processing speed specific to a bipolar transistor (also called BIP hereinafter) is now being watched with keen interest.

Especially in a field where a high performance is demanded, it is required to integrate the most advanced MOS technology with the BIP technology, and so-called the LDD structure is often employed as a preferable MOS structure. In this case, however, sometimes a BIP section may be damaged in reactive ion etching (RIE) of $SiO_2$ films when forming a spacer for forming the LDD structure. This effect is very remarkable especially in a lateral bipolar transistor because a surface section of the substrate is used as an active area of the device.

Detailed description is made hereinafter for the aforesaid problem with reference to the related art shown in FIG. 1A through FIG. 1D. The semiconductor device shown in these figures has both a lateral bipolar transistor section and a P channel MOS transistor section, and each of these figures is a cross sectional view of an upper section of the silicon substrate illustrating a production process thereof. The related art comprises the following steps (1) to (4).

(1) In a substrate 1, an $N^+$-filled up layer 2 and a diffusion layer 3 are formed in the bipolar transistor section. The filled-up layer 2 and the diffusion layer 3 function as a collector output for an NPN transistor (not shown) and a base output for an PNP transistor respectively. Then, after a LOCOS oxide film 4 and a $P^+$ diffusion layer 5 for device separation are deposited, a gate oxide film 6 is deposited. The thickness of the $SiO_2$ film is in a range from 400 to 500 as the LOCOS oxide film 4 and in a range from 10 to 20 nm as the gate oxide film 6. Then, openings (indicated by the reference numerals 21, 22) are arranged in the gate oxide film for forming an emitter electrode and a collector electrode for the lateral bipolar transistor section. With this operation, the structure as shown in FIG. 1A is obtained.

(2) A poly-Si film having the thickness from 200 to 400 nm is deposited by means of CVD, $N^+$ ions are implanted into a gate electrode of the MOS transistor section, $P^+$ ions are implanted into portions where an emitter electrode and a collector electrode for the lateral bipolar transistor section are formed, and then the aforesaid poly-Si film is processed by using the ordinary dry etching technology leaving a gate electrode for the MOS transistor section and an emitter electrode as well as a collector electrode for the MOS transistor section. With this operation, poly-Si sections 31,32 respectively for emitter and collector electrodes for a bipolar transistor section and a poly-Si section 33 for a gate electrode for a MOS transistor are formed. Then $P^-$ ion implantation is carried out in the MOS transistor section to form an LDD diffusion layer 8. Thus, the construction as shown in FIG. 1B is obtained.

(3) A $SiO_2$ film having a thickness from 200 to 400 nm is deposited by means of CVD, and a $SiO_2$ spacer 9 for forming a side wall-shaped LDD by carrying out anisotropic etching by means of dry etching. Then, a side wall 51 is formed also on the poly-Si films 31,32 for electrodes of the bipolar transistor, but in the etching process a base reactive area of the lateral bipolar transistor (indicated by the reference numeral 50) is exposed to over-etching. Then, $P^+$ ions are implanted into the MOS transistor section to form a source/drain diffusion layer 41. With this operation, the construction as shown in FIG. 1C is obtained.

(4) $P^+$ ions are diffused from the poly-Si films 31, 32 for emitter and collector electrodes respectively of the lateral bipolar transistor section by carrying out heat processing to form diffusion layers 11,12 for emitter and collector. Then, the source/drain diffusion layer 41 of the MOS section is activated simultaneously. Then, each electrode is formed using the conventional technology for forming a connection layer and the construction as shown in FIG. 1D is obtained. In FIG. 1D, output for the collector, emitter, and base are shown by C,E and B respectively, while output for the source and drain are shown by S and D respectively (The same is applicable in other figures).

However, the following problems exist in the related art as described above. Namely when forming the spacer 9 for forming an LDD as shown in FIG. 1C, the base reactive area 50 of the lateral bipolar transistor is exposed to over-etching. As this section is covered by only the gate oxide film 6 having a thickness from 10 to 20 nm, the surface of the Si substrate 1 is exposed in the aforesaid over-etching process, which causes etching damage. Because of the etching damage, such problems as drop of the Hfe due to increase of the base current and as well as drop of yield due to increase of a leakage current between the emitter and the collector occur.

OBJECTS AND SUMMARY OF THE INVENTION

An object of the present invention is to enable a configuration wherein a conductive film made of a material such as poly-Si for forming a gate electrode of a MOS transistor is used as a protective film for a base area, thus eliminating the necessity of additional processes to achieve the effect as described above.

A further object of the present invention is to make it possible, when producing Bi-CMOS semiconductor devices, to prevent devices from being degraded and to prevent the yield from becoming lower as in the related art so that an active area of a base of a bipolar transistor is not over-etched during anisotropic etching for forming a spacer for LDD in a MOS transistor and also to prevent price increase which would be caused by of additional processes for achieving the objects as described above.

DETAILED DESCRIPTION OF THE PREFERRED EMBODIMENTS

A detailed description is given for the preferred embodiment of the present invention with reference to the related drawings. It should be noted that the present invention is not limited to the embodiments described below.

The detailed description for the first embodiment of the present invention follows.

Figure 1A:
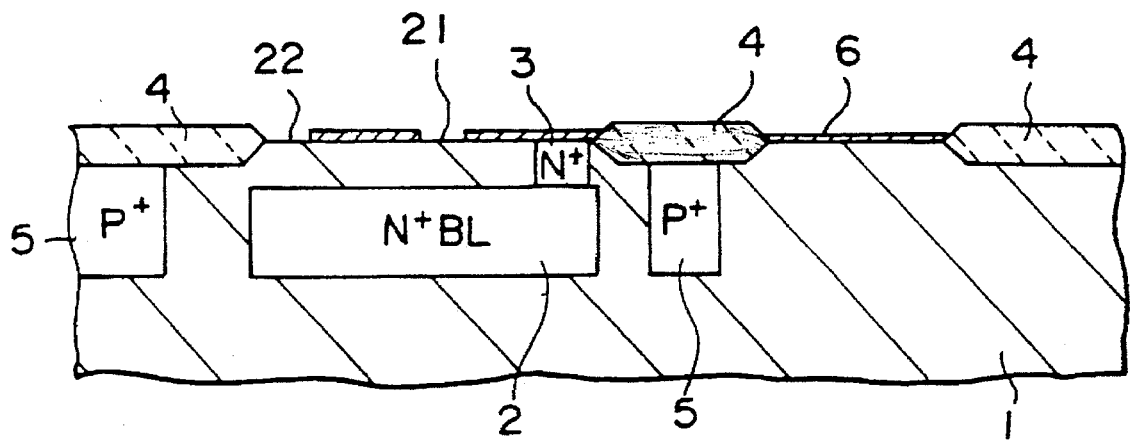
FIGS. 1A to 1D are drawings each illustrating a method of producing a Bi-CMOS devise based on the prior art.
Figure 1B:
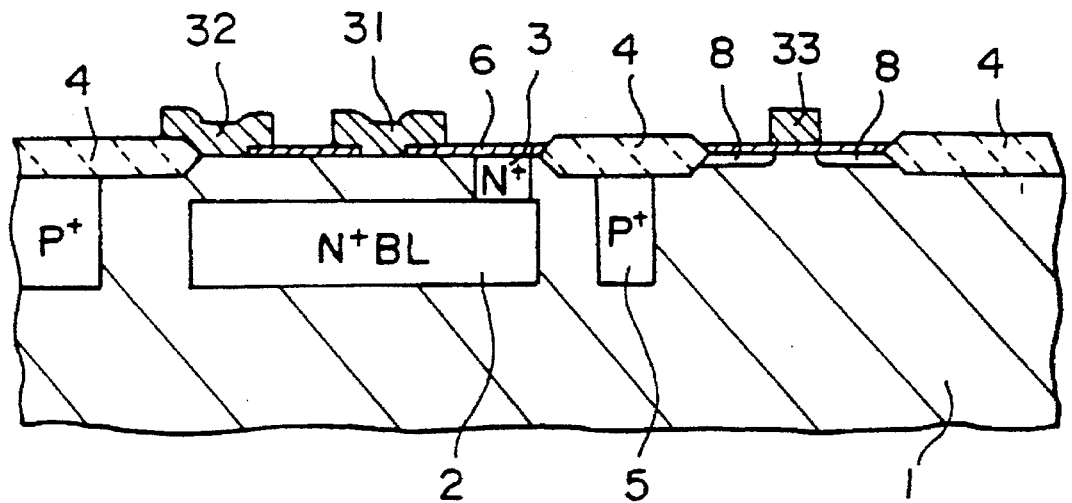
Figure 1C:
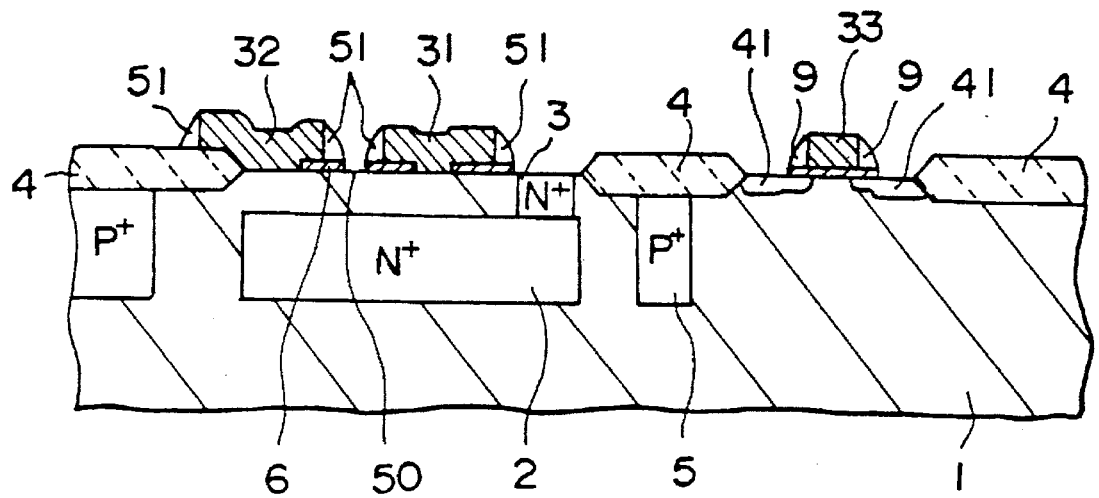
Figure 1D:
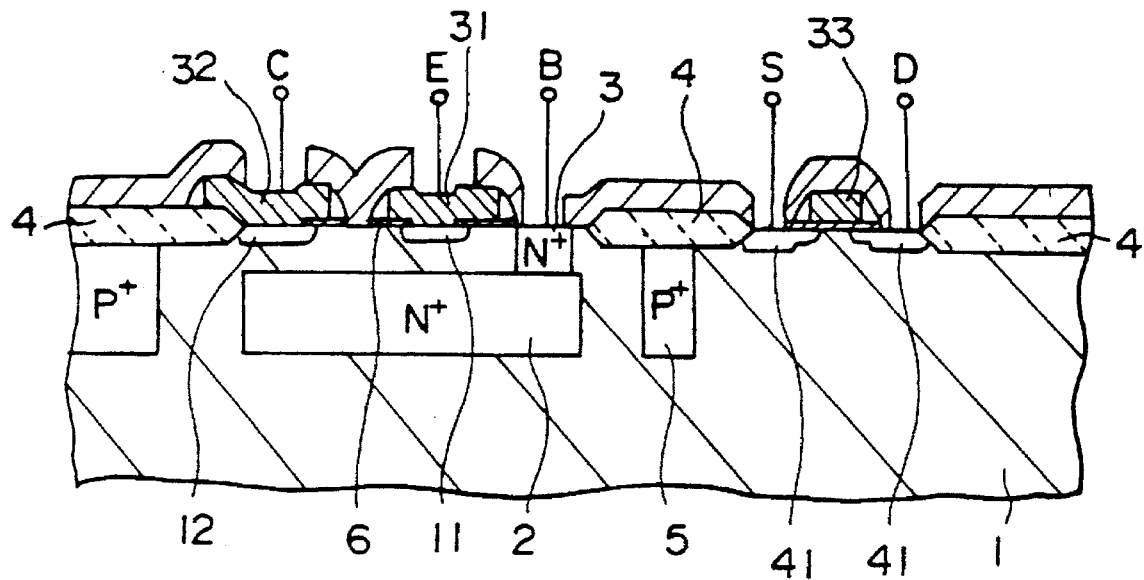
Figure 2:
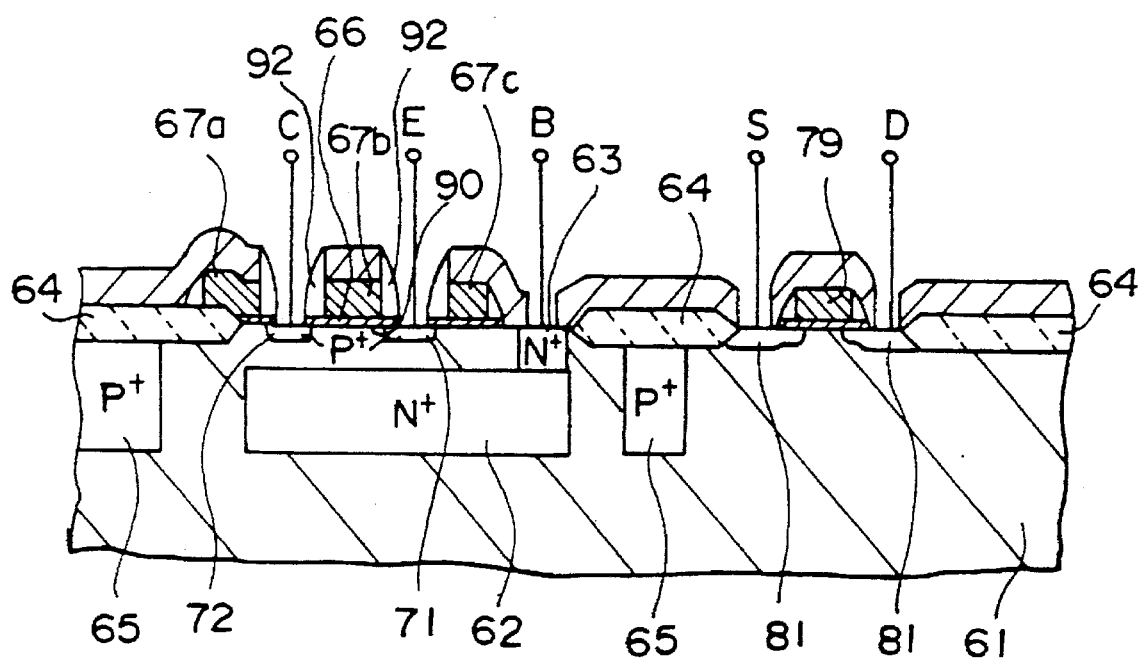
FIG. 2 and FIGS. 3A to 3C are cross sectional views each illustrating a construction of and a method of producing a Bi-CMOS device which is a first embodiment of the present invention.
Figure 3A:
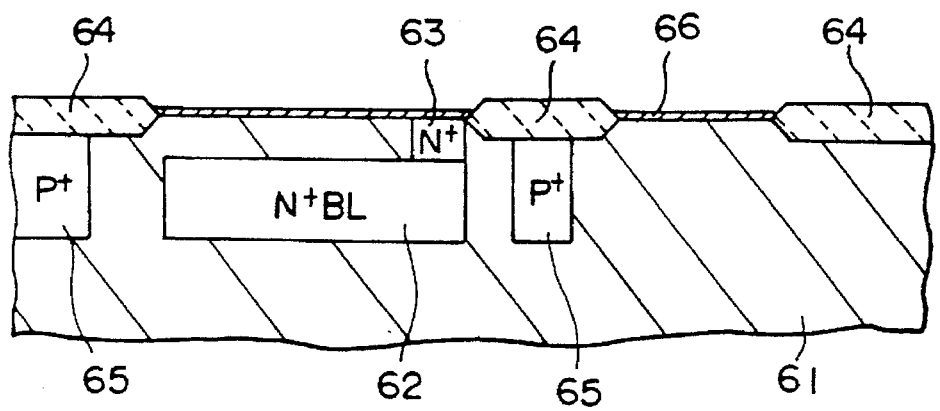
Figure 3B:
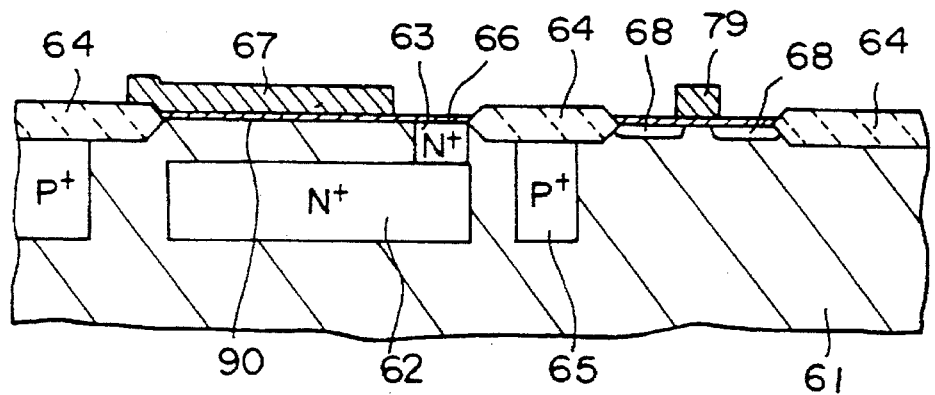
Figure 3C:
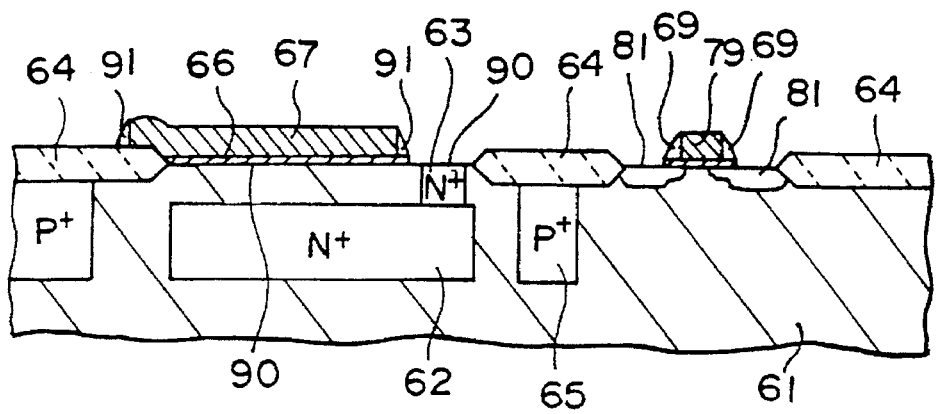

In this embodiment, the present invention is applied to a Bi-CMOS semiconductor device comprising a lateral bipolar transistor section and a MOS transistor section. FIG. 2 is a cross sectional view illustrating the device, while FIGS. 3A to 3C are drawings each illustrating the production of the device with a cross sectional view of an upper section of a silicon substrate in a bipolar transistor section in the device for explanation of the production process.

A semiconductor device according to the present embodiment is characterized in that a base area 90 is covered with an insulating film (herein a gate oxide film 66 made of $SiO_2$) which is deposited on a semiconductor substrate 61 (herein a Si substrate) and a conductive film 67 (herein a poly-Si film) deposited on the insulating film 66.

The production process of the semiconductor device according to the present embodiment comprises the steps (1) to (4) as described below.

(1) In the substrate 61, an $N^+$ filled-up layer 62 and a diffusion layer 63 are formed in the bipolar transistor section. The filled-up layer 62 and the diffusion layer 63 function as a collector output for an NPN transistor (not shown) and a base output for the NPN transistor. Then, after a LOCOS oxide film 64 and a $P^+$ diffusion layer 65 for device separation are formed, a gate oxide film 66 is deposited. An $SiO_2$ film having a thickness from 400 to 500 nm is deposited as the LOCOS film 64, and a layer having a thickness from 10 to 20 nm is deposited as the gate oxide film 66. With this operation, the construction as shown in FIG. 3A is obtained.

(2) A poly-Si film having a thickness from 200 to 400 is deposited by means of CVD, $N^+$ ion implantation is carried out to a gate electrode of the MOS transistor section, $P^+$ ion implantation is carried out to portions for forming an emitter and a collector for the lateral bipolar transistor section respectively, and then the aforesaid poly-Si film is processed by means of dry etching so that the gate electrode (indicated by the reference numeral 79) for the MOS transistor section and the lateral bipolar transistor section (indicated by the reference numeral 67) are left. In this process, an area for forming a base of the lateral bipolar transistor is covered with the aforesaid poly-Si film (conductive film). Then $P^-$ implantation is carried out in the MOS transistor section to form an LDD diffusion layer 68. With this operation, the construction as shown in FIG. 3B is obtained.

(3) An $SiO_2$ film having a thickness from 200 to 400 nm is deposited by means of CVD, and side wall shaped spacers 69 made of $SiO_2$ for forming LDD are formed by carrying out anisotropic etching by means of CVD etching. In this process the base active area of the lateral bipolar transistor 90 can be protected because the area has been covered with poly-Si in the previous step (2) even when the spacers 69 are made of $SiO_2$ for forming LDD are formed by means of anisotropic etching, thus this section is prevented from being exposed to over-etching. For this reason, such problems as degradation of chips or drop of yield as in the prior art do not occur. Furthermore by using a conductive film such as that made of poly-Si for forming a gate electrode in a MOS transistor section as the protecting film (See the section indicated by the reference numeral 67 in FIG. 3B), it is possible to form a protecting film without introducing any additional process, and without increasing production costs. Then a source/drain diffusion layer 81a is formed by carrying out $P^+$ ion implantation in the MOS transistor section. With this operation, the construction as shown in FIG. 3C is obtained.

(4) An $SiO_2$ film having a thickness from 300 to 400 nm is formed by means of CVD, and then openings for an emitter section and a collector section of lateral bipolar transistor section are provided on the $SiO_2$/poly-Si laminated film. Then an $SiO_2$ film having a thickness from 200 to 400 run is formed and a spacer 92 (shown in FIG. 2) made of $SiO_2$ for separation of an emitter electrode from a collector electrode is formed. $P^+$ ions are diffused into the emitter and collector sections of the lateral bipolar transistor section to form an emitter and a collector. Then, the source/drain layer 81 of the MOS transistor section is activated simultaneously. Then each electrode is formed using a wiring technology based on the prior art, and the construction as shown in FIG. 2 is obtained.

In the embodiments described above, when producing Bi-CMOS LSIs, in anisotropic etching for forming a spacer for a LDD in a MOS transistor section, by covering a base active area of a lateral bipolar transistor with a protecting film, the base active area is prevented from being exposed to over-etching, and such problems as degradation of chips or drop of yield as in the prior art are prevented. Furthermore, since a conductive film made of a material such as poly-Si for forming a gate electrode of a MOS transistor section is used as the protective film, the effect of a protecting film as described above can be achieved without introducing any additional process, or cost increases.

Description is made hereinafter for a second embodiment of the present invention.

Although, in Embodiment 1 described above, the poly-Si film used as a protective film for a base active area is electrically independent, it is preferred that the electrical potential of the poly-Si film be the same as that of the emitter. This is for prevention of troubles as fluctuation of a surface electrical potential in the base active area.

Figure 4:
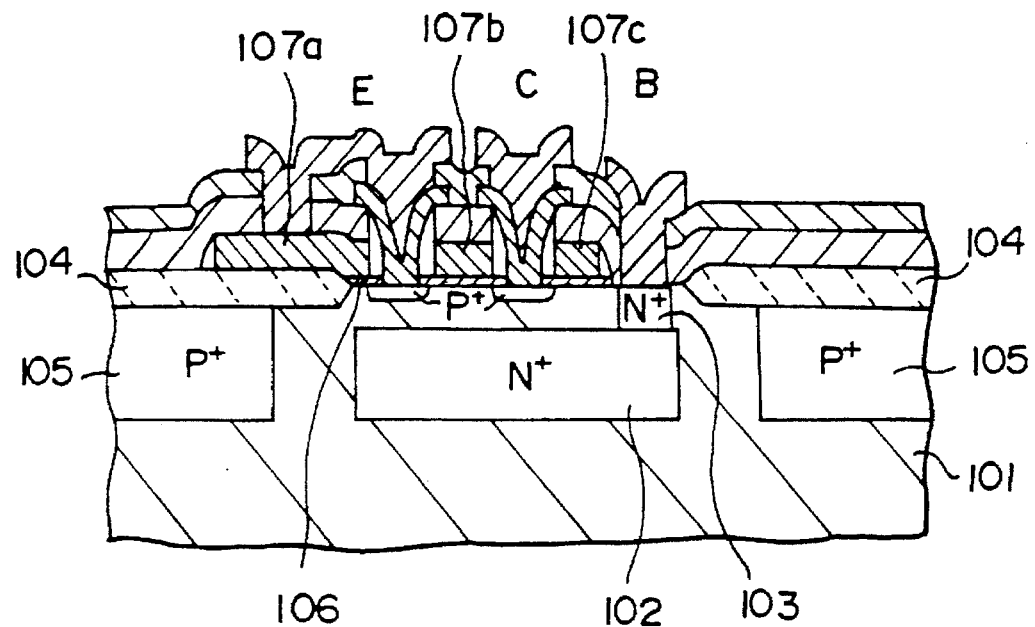
FIG. 4 is a cross sectional view illustrating a construction of a lateral PNP transistor of another Bi-CMOS device which is a second embodiment of the present invention.

In the present embodiment, this problem has been overcome, and FIG. 4 is a cross sectional view illustrating a device according to this embodiment. In this device, the emitter and the poly-Si film used as a protective film for the base active area are connected by an Al electrode. Furthermore in this embodiment, an emitter and a collector are formed by means of diffusion from the poly-Si film. FIG. 4 shows a portion of the construction. It is possible to use in this poly-Si film the same poly-Si as that which is used for an emitter electrode in V-NPN and V-PNP transistors. Furthermore, as the depth of diffusion for the emitter and collector can be reduced by making use of diffusion from the poly-Si film, this technology is advantageous for maintenance of $V_{CBO}$ and elimination of Cje and Cjc. A substrate 101 is formed with embedded region 102 (n+) and 105 (p+). A base connection region 103 connects to region 102. An insulation layer 104 is formed on the surface of substrate 103. A layer 106 with portions connect the emitter to emitter lead 107a, to the base lead 107b and to the collector lead 107c.

As described above, the present invention can provide a semiconductor device which does not produce any damage during etching. Especially when producing a high performance Bi-CMOS semiconductor according the present invention, it is possible to prevent drops in of performance and yield of a bipolar transistor and especially a lateral bipolar transistor due to etching damages when forming an LDD spacer, which enables production of a high performance and low cost Bi-CMOS LSI.

Next, description is made hereinafter for the third embodiment of the present invention.

Figure 5:
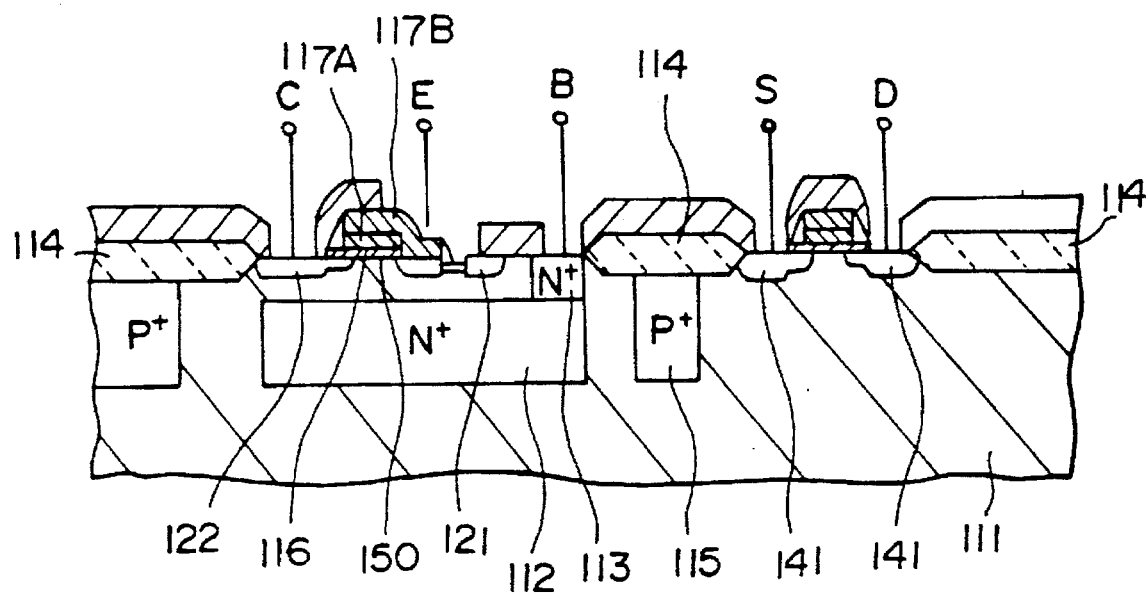
FIG. 5 and FIGS. 6A to 6C are drawings each illustrating a construction and a method of producing a different lateral PNP transistor of a Bi-CMOS device which is a third embodiment of the present invention.
Figure 6A:
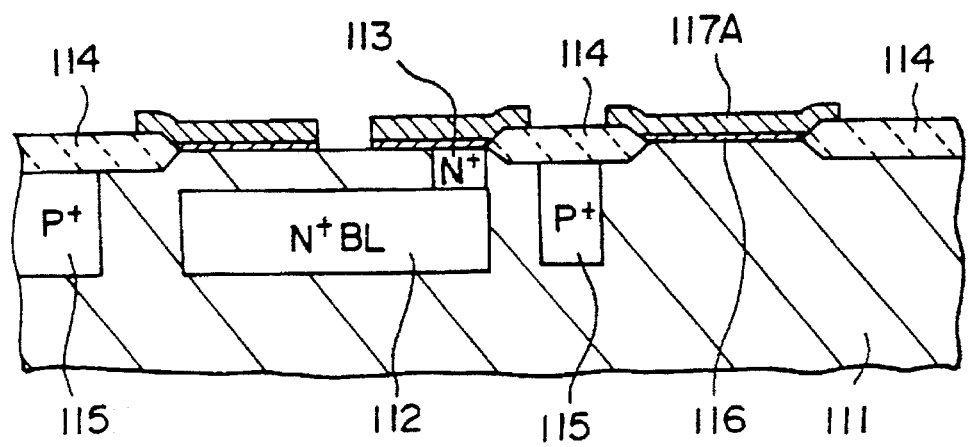
Figure 6B:
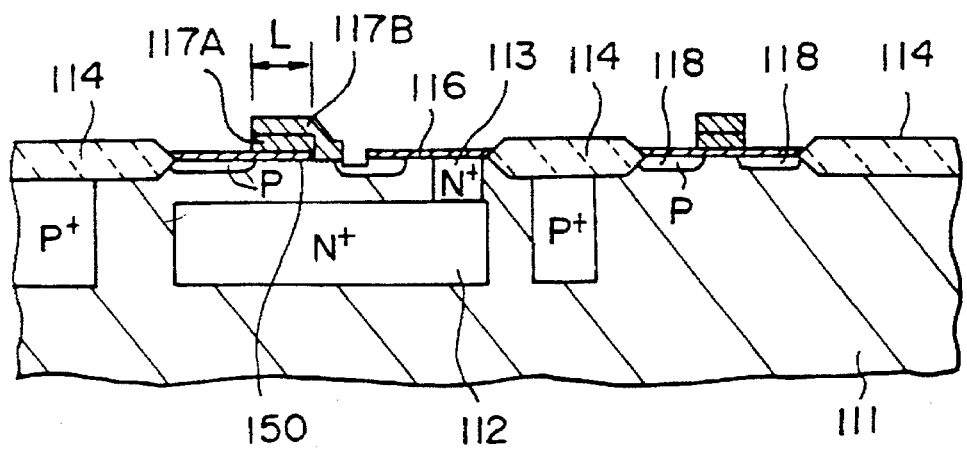
Figure 6C:
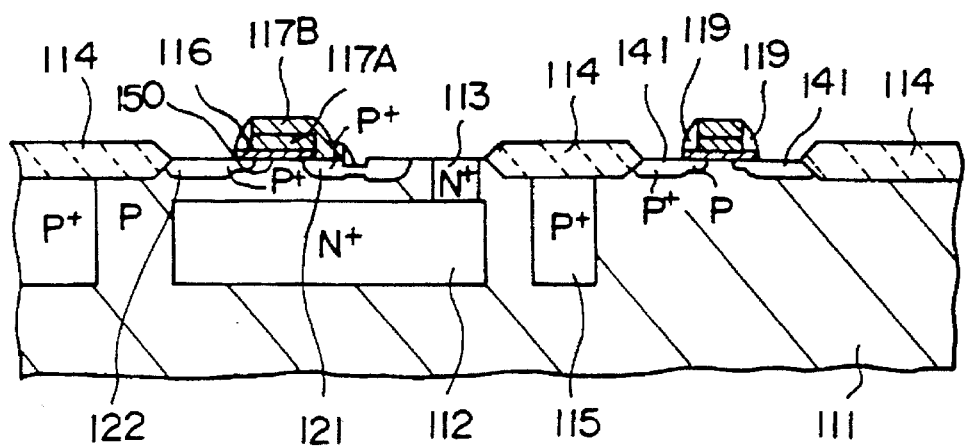

In this embodiment, the present invention is applied to the production of a Bi-CMOS semiconductor device comprising a lateral transistor section and a P-channel MOS transistor section. FIG. 5 is a cross sectional view of the device, while FIGS. 6A to 6C are drawings each illustrating the production process with a cross section of an upper section of the silicon substrate.

In the semiconductor device according to the present embodiment, as shown in FIG. 5, a base area 150 is covered with an insulating film 116 (herein a gate oxide film made of SiO₂) deposited on a semiconductor substrate 111 (herein an Si substrate) and a conductive film 117 (herein made of poly-Si films 117A, 117B) each deposited on the insulating film 116, and the conductive film 117 (poly-Si film 117B) is connected to the substrate 111. Collector 122 and emitter 121 are shown as are source and drains 141.

The method of producing a semiconductor device according to this embodiment comprises the following steps (1) to (4).

(1) An N filled-up layer 112 and a diffusion layer 113 are formed in a bipolar transistor section of the substrate 111. This N filled-up layer 112 and the diffusion layer 113 function as a collector output of an NPN transistor (not shown) and a base output of a PNP transistor. Then, after a LOCOS oxide film 114 and a P diffusion layer 115 for device separation are formed, a gate oxide film is deposited as an insulating film 116. An SiO₂ film having a thickness from 400 to 500 nm is deposited as the LOCOS oxide film 114, and a thickness from 10 to 20 nm is deposited as the gate oxide film 116. Then, a poly-Si film having a thickness from 100 to 200 nm is deposited on the entire surface of the substrate by means of CVD, and then an opening is formed on the poly-Si/gate oxide laminated film in a portion for forming an emitter for a lateral bipolar transistor section (Refer to FIG. 6A). A poly-Si film 117A serves as a protective film for the gate oxide film 116 in the aforesaid process for forming an opening. For this reason, it is possible to prevent the gate oxide film from being contaminated so as to suppress the generation of faults such as poor voltage resistance during a process for removing a resist when forming an opening in the gate oxide film 116.

(2) A poly-Si film (which becomes a poly-Si film 117B after processed) having a thickness from 100 to 200 nm is deposited by means of CVD. The total thickness of the poly-Si film with combined with the poly-Si CVD film is in a range from 300 to 400 nm. Then, N ion implantation is carried out into a gate electrode of the MOS transistor and P ion implantation is carried out into a portion for forming an emitter electrode of the lateral bipolar transistor section, and then the aforesaid poly-Si film is processed by means of dry etching so that a gate electrode of the MOS transistor and an emitter electrode of the lateral bipolar transistor section will be left.

In this process, the width of the base (Wb) is decided by mask alignment between the poly Si film 117A in the first layer and the poly-Si film 117B in the second layer, and in principle the width can be reduced to around 0.1 μm and a smaller construction can be built than in advanced technology devices such as laser lithography or i-line lithography. Furthermore, because of the poly-Si film 117B in the second layer, electrical connection with the Si substrate is automatically established and the electrical potential of the poly-Si film 117A in the first layer can be maintained at the same level as that of the emitter, so that troubles such as fluctuation of surface electrical potential of the base active area due to introduction of electrical charge into the aforesaid poly-Si film can be prevented. Then, P ion implantation is carried out to the MOS transistor section to form an LDD diffusion layer 118 which form source and drains. With this operation, the construction as shown in FIG. 6B is obtained.

(3) An SiO₂ film having a thickness from 200 to 400 nm is deposited, and anisotropic etching is carried out by means of dry etching to form an SiO$_s$ space for LDD having a form like a side wall.

In this process, as the base active area 150 of the lateral bipolar transistor has been covered with a poly-Si film in the previous step, so that the base active area can be protected when forming an SiO₂ spacer for LDD during anisotropic etching and also this section can be prevented from being exposed to over-etching. For this reason, such problems as degradation of a device and drop in yield as those in the related art are not generated. Furthermore, by using a conductive film made of such a material as poly-Si for forming a gate electrode of the MOS transistor section as the protective film, this protective film can be formed without introducing any additional steps and also increase costs does not occur. Then, P ion implantation is carried out into the MOS transistor section to form a source/drain diffusion layer 118. With this operation, the construction as shown in FIG. 6C is obtained.

(4) P is diffused from a poly-Si film constituting emitter/collector electrodes of the lateral bipolar transistor section to form diffusion layers 121,122 for the emitter and collector by depositing an SiO film having a thickness from 300 to 400 nm by means of CVD and then processing the film with heat. Simultaneously, the source/drain diffusion layer 141 of the MOS transistor section is activated. Then, each electrode is formed by using the conventional technology for forming a connection layer to obtain a semiconductor device having the construction as shown in FIG. 5.

In the embodiments described above, when producing Bi-CMOS LSIs, in anisotropic etching for forming a spacer for LDD in a MOS transistor section, by covering a base active area of a lateral bipolar transistor with a protecting film, the base active area is prevented from being exposed to over-etching, and generation of such problems as degradation of chips or drop in yield as those in the past ARE prevented. Furthermore, as a conductive film made of such a material as poly-Si for forming a gate electrode of a MOS transistor section is used as the protecting film, the effect by a protecting film as described above can be achieved without introducing any additional process, or by increasing cost.

Furthermore, a conductive film made of a material such as poly-Si for forming a gate electrode can be formed in a 2-layered form, so that generation of such faults as pressure resistance fault due to contamination of a gate oxide film in a process to separate a resist when providing an opening in the gate oxide film can be prevented, and also it is possible to improve the characteristics by allowing reduction of the base width.

As described above, the present invention can provide a semiconductor device which does not receive any damage during etching as well as a method of producing the device, and especially when producing a high performance Bi-CMOS semiconductor device, if the present invention is applied, it is possible to prevent a drop in performance and yield of a bipolar transistor and especially a lateral bipolar transistor due to etching damages when forming an LDD spacer, which enables production of a high performance and low cost Bi-CMOS LSI. The numbers in FIG. 6C correspond to those in FIG. 5 except 119 indicates side wall layers.

Figure 7:
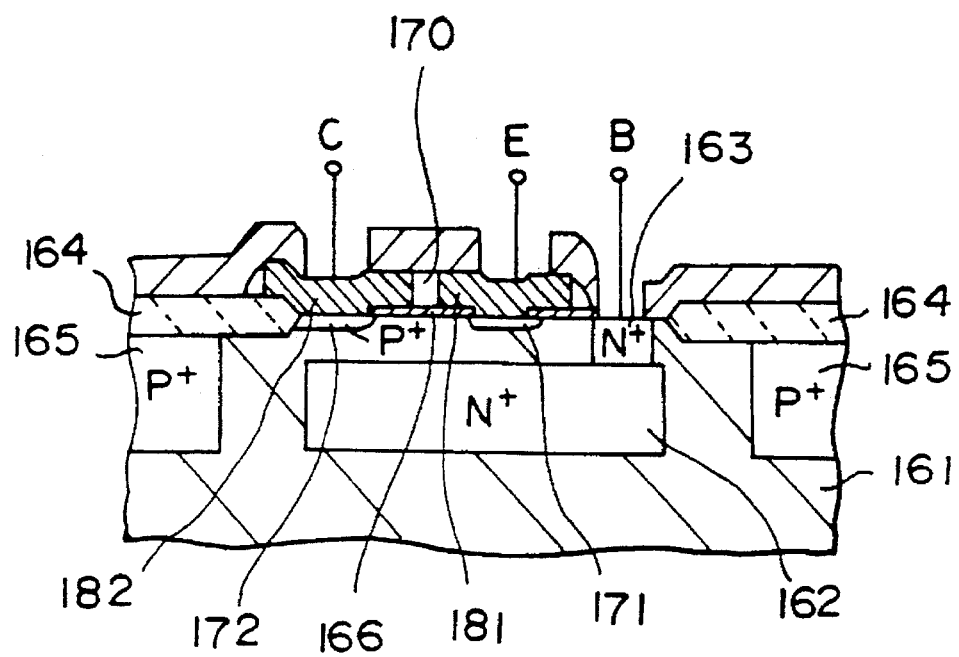
FIG. 7 and FIGS. 8A to 8C are drawings each illustrating a construction of and a method of producing a furthermore different lateral PNP transistor of a Bi-CMOS which is a fourth embodiment of the present invention.
Figure 8A:
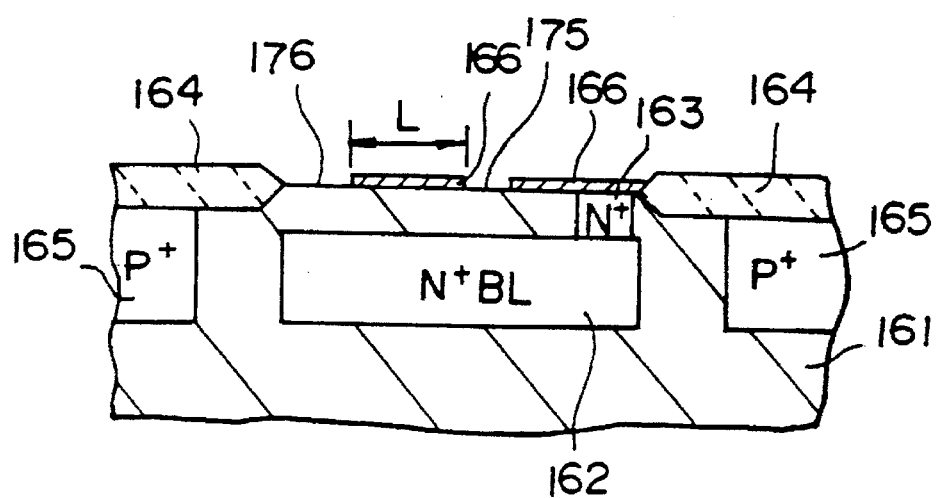
Figure 8B:
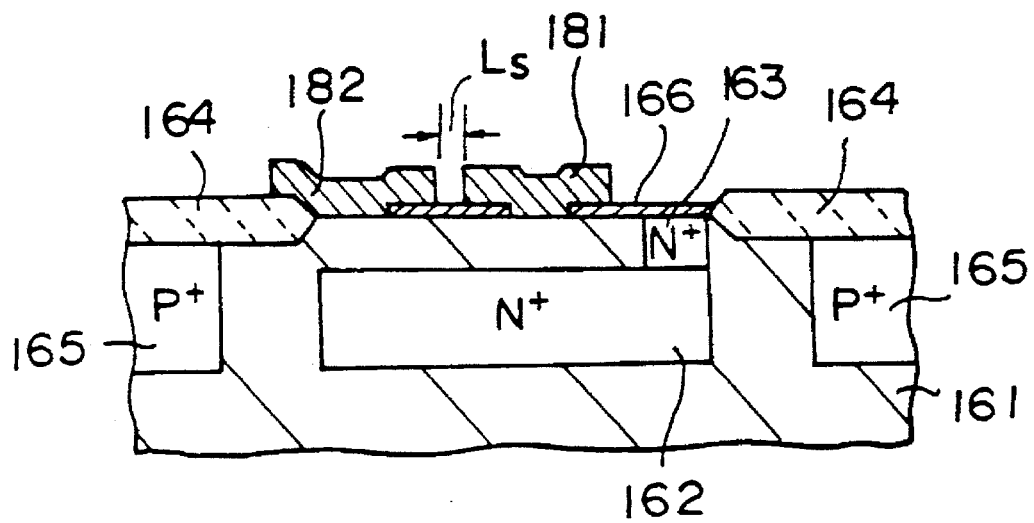
Figure 8C:
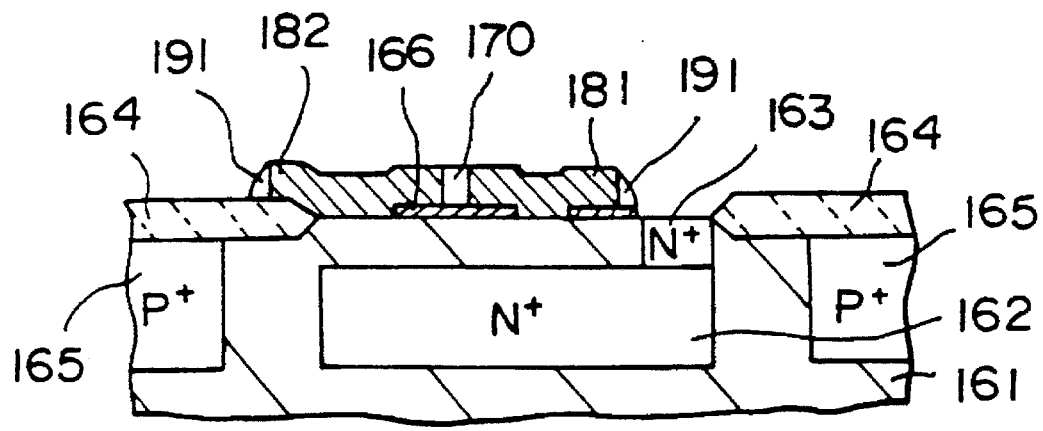

Next, description is made for the fourth embodiment of the present invention. In this embodiment, the present invention is applied to production of a Bi-CMOS semiconductor device having a lateral bipolar transistor section. FIG. 7 is a cross sectional view of a semiconductor device according to the present invention, while FIGS. 8A to 8C are drawings each illustrating a production process to obtain the construction as shown in FIG. 7.

A semiconductor device according to this embodiment comprises, as shown in FIG. 7, an insulating film (gate insulating film) 166 deposited on a semiconductor substrate 161, a pair of conductive films 181, 182 which are deposited so that each covers at least one end section the aforesaid insulating film 166 respectively (poly-Si film), the substrate existing just below the heat conductive films 181,182, and opposite conductive type of diffusion layers 171,172, and an insulating film 170 (SiO$_2$) is filled between the pair of conductive films 181,182.

In the present embodiment, a pair of conductive films 181, 182 each made of poly-Si form an emitter and a collector of a bipolar transistor (especially a lateral bipolar transistor) respectively.

The lateral bipolar transistor according to the present embodiment is produced according to the steps (1) to (4) as described below. Refer to FIGS. 8A to 8C as well as to FIG. 7.

(1) In a substrate 161, an N$^+$ filled-up layer 162 and a diffusion layer 163 are formed in the bipolar transistor section. The filled-up layer 162 and the diffusion layer 163 function as a collector output for an NPN transistor (not shown) and a base output for a PNP transistor respectively. Then, after a LOCOS oxide film 164 and a P$^+$ diffusion layer 165 are deposited, a gate oxide film 166, which is an insulating film, is deposited. An SiO$_2$ having a thickness from 400 to 500 nm is deposited as the LOCOS oxide film 164 and that having a thickness from 10 to 20 nm is deposited as the gate oxide film 166. Then, openings in the gate oxide film 166 in portions for forming an emitter and a collector of the lateral bipolar transistor section are formed (the openings are indicated by the reference numerals 175, 176). With this operation, the construction as shown in FIG. 8A is obtained. In this process, a width of a base of the lateral bipolar transistor is decided according to the width of the gate oxide film 166 which remains on the surface of the silicon substrate 161 (indicated by the sign L in the figure).

(2) A poly-Si film having a thickness from 200 to 400 nm is deposited by means of CVD. N$^+$ ion implantation is carried out to a gate electrode of the MOS transistor section, P$^+$ ion implantation is carried out to portions for forming an emitter and a collector of the lateral bipolar transistor section, and then the aforesaid poly-Si film is processed by means of ordinary dry etching so that a gate electrode of the MOS transistor section and emitter/collector electrodes for the lateral bipolar transistor section are left. With this operation, poly-Si sections 181,182 for emitter and collector electrodes of the bipolar transistor section are formed. It should be noted that a gate electrode made of poly-Si may be formed in the MOS transistor section simultaneously. In this process, the distance between the emitter electrode and the collector electrode of the lateral bipolar transistor section (L, in the figure) is set to be about 2 times the thickness of the insulating CVD film for LDD spacer which is deposited in the next step (3). It is possible to reduce this distance L$_s$ to around 0.3 μm by using an advanced technology such as the excimer laser lithography, i-line lithography, or a phase shift technology. Then, P$^-$ ion implantation is carried out to the MOS transistor section to form an LDD diffusion layer (not shown herein. Refer to the figures illustrating the related art). With this operation, the construction as shown in FIG. 8B is obtained.

(3) An SiO$_2$ film having a thickness from 200 to 400 nm is deposited by means of CVD. In this process, a space between the emitter electrode and the collector electrode of the lateral bipolar transistor section is set to be around 2 times the thickness of the SiO$_2$ CVD film for LDD spacer as described in the step (2), so that the space is filled up with this SiO$_2$ film. For this reason, when forming a SiO$_2$ film spacer for LDD continuously by means of anisotropic etching, it is possible to protect a base active area of the lateral bipolar transistor by covering it with an SiO$_2$ film. In FIG. 8C, an insulating film for filling up the space is indicated by the reference numeral 170. As a result, the base active area is prevented from being exposed to over-etching. Because of this feature, such troubles as degradation of a device or drop of yield do not occur. Furthermore, cost increase due to introduction of any additional steps are prevented by using an insulating film made of such a material such as SiO$_2$ for forming a spacer as this protective film. Then, P$^+$ ion implantation is carried out to the MOS transistor section to form a source/drain diffusion later (not shown). With this operation, the construction as shown in FIG. 8C is obtained. Side regions 191 are formed on the end layers 181 and 182.

(4) By carrying out heat processing, P' is diffused from the poly-Si films 181,182 for emitter and collector electrodes of the lateral bipolar transistor section, and diffusion layers 171,172 for emitter and collector are formed. In this process, both the source and drain diffusion layers of the MOS transistor section are activated simultaneously. Then, each electrode is formed by using the conventional technology for forming a connection layer. With this operation, a semiconductor device having the construction as shown in FIG. 7 is obtained.

As described above, with the present embodiment, it is possible to prevent a base active area of a lateral bipolar transistor from being exposed to over-etching and also to prevent such problems as degradation of a device and drop of yield as in the related art by covering the base active area of the lateral bipolar transistor with a protective area (insulating film). Furthermore, the objects as described above can be achieved by using an insulating film made of such a material as $SiO_2$ for forming a spacer as this protective area without introducing any additional step.

Next, description is made for the fifth embodiment of the present invention.

In the 4 embodiments described above, in a step to remove a resist when forming openings in portions of the gate oxide film for forming emitter and collector electrodes of the lateral bipolar transistor section in step (1), a gate oxide film 206 may be contaminated, which may in turn cause such faults as a voltage resistance fault. In this embodiment, even the problems as described above are solved.

Figure 9:
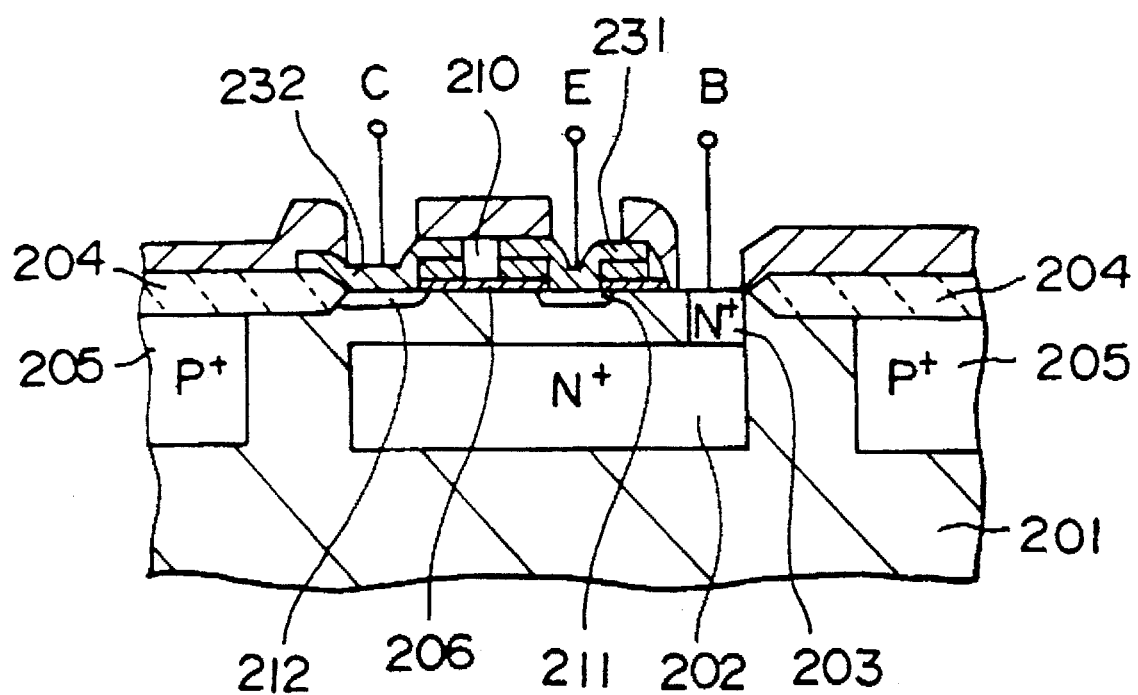
FIG. 9 and FIGS. 10A to 10C are drawings each illustrating a construction of and a method of producing a still different lateral PNP transistor of a Bi-CMOS device which is a fifth embodiment of the present invention.
Figure 10A:
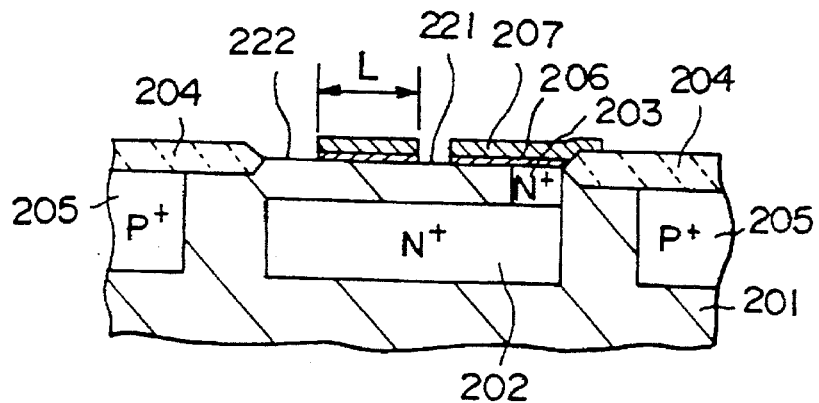
Figure 10B:
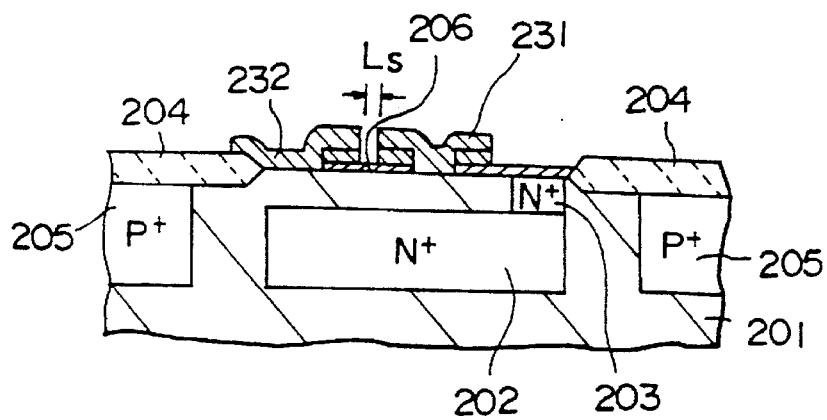
Figure 10C:
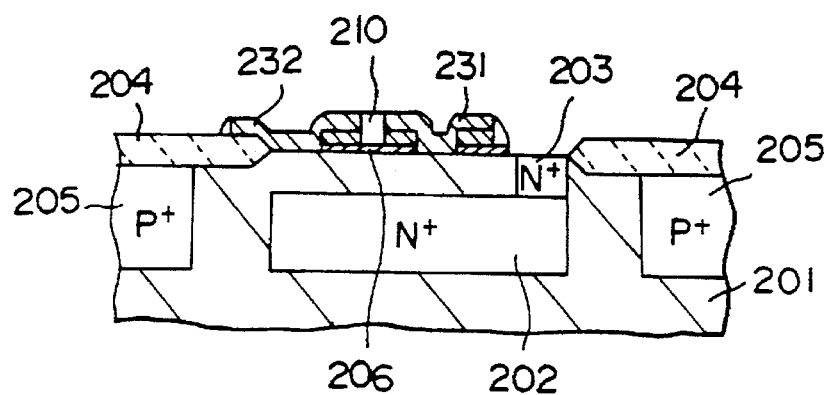

FIG. 9 is a cross sectional view of a semiconductor device according to the present embodiment, while FIGS. 10A to 10C are drawings each illustrating the production process. In this embodiment, a Bi-CMOS transistor is produced through the steps (1) to (4) as described below.

(1) An $N^+$ filled-up layer 202 and a diffusion layer 203 are formed in a bipolar transistor section of a substrate 201. The filled-up layer 202 and the diffusion layer 203 function as a collector output for an NPN transistor (not shown) and a base output for a PNP transistor. Then, after a LOCOS oxide film 204 and a $P^+$ diffusion layer 205 are formed for device separation, a gate oxide film 206 is deposited as an insulating film. An $SiO_2$ film having a thickness from 400 to 500 nm is deposited as the LOCOS oxide film 204 and that having a thickness from 10 to 20 nm is deposited as the gate oxide film. Then, after a poly-Si film 207 as should in FIG. 10A having a thickness from 100 to around 200 nm is deposited on the entire surface of a substrate by means of CVD, openings are provided in portions of the poly-Si Gate oxide laminated film for emitter and collector electrodes for emitter 211 and collector 212 of the lateral bipolar transistor section (the openings indicated by the reference numerals 221, 222). When the openings are formed, the poly-Si film 207 functions as a protective film for the gate oxide film 206. In this process, the base width of the lateral bipolar transistor is width (L in the figure) of the gate oxide film left on the surface of the silicon substrate as in the previous embodiment. With this operation, the construction shown in FIG. 10A is obtained.

(2) A poly-Si film having a thickness from 100 to 200 nm is deposited by means of CVD. The total thickness of the poly-Si film when combined with the poly-Si CVD film is in a range from 300 to 400 nm as in the previous embodiment. $N^+$ ion implantation is carried out into the gate electrode of the MOS transistor section, $P^+$ ion implantation is carried out to portions for forming emitter and collector electrodes of the lateral bipolar transistor, and then the aforesaid poly-Si film is processed by means of dry etching so that the gate electrode of the MOS transistor section and the emitter and collector electrodes of the lateral bipolar transistor section are left. With this operation, the construction as shown in FIG. 10B having eletrodes 231, 232 made of poly-Si is obtained. In this process, a space (Ls in the figure) between the emitter electrode and the collector electrodes of the lateral bipolar transistor section is set to be around 2 times of a the thickness of the insulating CVD film for LDDspacer which is to be deposited in the subsequent step (3). With this operation, it is possible to fill the gap with the insulating film 210 (Refer to FIG. 10C) for protection. Then, P ion implantation is carried out into the MOS transistor section to form an LDD diffusion layer (not shown herein). The subsequent steps (3) and (4) are the same as those in the previous embodiment. The same reference numerals are used in FIG. 10C and FIG. 9, so that detailed description is omitted herein.

As described above, with the present invention, in production of a semiconductor device, it is possible to provide a semiconductor device which does not give any damage in etching like in the related art as well as a method of producing the device, and especially when producing a high performance Bi-CMOS semiconductor device, it is possible to prevent degradation of a lateral bipolar transistor and drop of yield in production thereof, so a high performance and low cost Bi-CMOS LSIs can be produced.

What is claimed is:

1. A bipolar transistor in which injury to a base region is prevented by providing a conductive film over an insulation film on a substrate in which the transistor is formed comprising, spaced collector and emitter regions both of a first conductivity type in the surface of said substrate of a second conductivity type, a first insulating layer formed on said substrate between said spaced collector and emitter regions, a conductive layer formed on said first insulation layer between said emitter and collector regions, a lateral base connection connected to said substrate between said emitter and collector regions, a space formed in said conductive layer to form separate collector and emitter electrodes, and a second insulating layer formed in said space formed in said conductive layer, and also formed on the opposite ends of said conductive layer adjacent said collector and emitter regions so as to form insulation side walls thereon.

2. A bipolar transistor comprising:
   a substrate formed by a first conducting type semiconductor;
   a buried region formed by a second conducting type semiconductor region in said substrate;
   a first isolation region formed by a first conducting type semiconductor in said substrate;
   a first diffusion region formed by a second conducting type semiconductor in said substrate;
   a second diffusion region formed by a second conducting type semiconductor in said substrate;
   a second isolation region formed by a isolation layer on said substrate between said first and second diffusion region;
   a first electrode region formed by a conducting layer on said first diffusion region and said second isolation region;
   a second electrode region formed by said conducting layer on said second diffusion region and said second isolation region;
   a third isolation region formed by a isolation layer on said second isolation region isolating said first and second electrodes; and
   a third electrode connected to said buried region via a third diffusion region; and wherein said third isolation region is surrounded by a side wall.

3. A bipolar transistor according to claim 2 wherein said third isolation region is formed by said conducting layer on said second isolation region.

* * * * *

UNITED STATES PATENT AND TRADEMARK OFFICE
CERTIFICATE OF CORRECTION

PATENT NO. : 5,666,001
DATED : September 9, 1997
INVENTOR(S) : Hiroyuki Miwa

It is certified that error appears in the above-identified patent and that said Letters Patent is hereby corrected as shown below:

On the title page:

[73] change Assignee: "Siemens Aktiengesellschaft, Munich, Germany" to --Sony Corporation, Tokyo, Japan--

Signed and Sealed this

Twenty-fifth Day of August, 1998

Attest:

BRUCE LEHMAN

*Attesting Officer*  *Commissioner of Patents and Trademarks*